United States Patent
Rahbar et al.

(10) Patent No.: US 9,444,474 B2
(45) Date of Patent: Sep. 13, 2016

(54) CRYSTAL OSCILLATOR NOISE COMPENSATION METHOD FOR A MULTI-LOOP PLL

(71) Applicant: Microsemi Semiconductor ULC, Kanata (CA)

(72) Inventors: Kamran Rahbar, Kanata (CA); Qu Gary Jin, Kanata (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 15 days.

(21) Appl. No.: 14/698,966

(22) Filed: Apr. 29, 2015

(65) Prior Publication Data
US 2015/0326232 A1    Nov. 12, 2015

Related U.S. Application Data

(60) Provisional application No. 61/990,733, filed on May 9, 2014.

(51) Int. Cl.
| H03L 7/06 | (2006.01) |
| H03L 7/099 | (2006.01) |
| H03B 5/32 | (2006.01) |
| H03L 7/07 | (2006.01) |
| H03L 7/093 | (2006.01) |

(52) U.S. Cl.
CPC ............ *H03L 7/099* (2013.01); *H03B 5/32* (2013.01); *H03L 7/07* (2013.01); *H03L 7/093* (2013.01); *H03L 7/0991* (2013.01)

(58) Field of Classification Search
USPC .............. 327/2–12, 105–123, 141, 144–163; 331/15–17; 375/373–376
See application file for complete search history.

(56) References Cited

U.S. PATENT DOCUMENTS

| 4,888,564 A * | 12/1989 | Ishigaki | H03L 7/191 331/1 A |
| 5,317,284 A * | 5/1994 | Yang | H03L 7/23 331/11 |
| 6,016,080 A * | 1/2000 | Zuta | H03L 7/085 324/76.82 |
| 7,986,190 B1 * | 7/2011 | Lye | H03L 7/16 331/1 A |
| 9,112,517 B1 * | 8/2015 | Lye | H03L 7/087 |
| 2013/0335150 A1 * | 12/2013 | Sai | H03L 7/0991 331/15 |
| 2015/0200770 A1 * | 7/2015 | Rahbar | H04L 7/0331 375/376 |

* cited by examiner

*Primary Examiner* — Brandon S Cole
(74) *Attorney, Agent, or Firm* — Marks & Clerk; Richard J. Mitchell

(57) ABSTRACT

A multi-loop phase locked loop (PLL) system with noise attenuation has a first PLL including a local oscillator, a second PLL coupled to an output of the first PLL, and a third PLL in a feedback path between the second PLL and first PLL. A first phase comparator compares an input signal with the first feedback signal to generate a first phase error signal for the first PLL. The first phase error signal is multiplied by a scaling factor k determining the amount of noise attenuation. The third PLL has a bandwidth preferably at least ten times higher than the second PLL so that the overall transfer function of the second and third PLLs is approximately the transfer function of the second PLL. The transfer function of the third PLL is multiplied by a scaling factor 1/k. This arrangement allows the use of an uncompensated local oscillator in the first PLL. The noise generated in the uncompensated local oscillator is reduced by the attenuation factor k.

20 Claims, 3 Drawing Sheets

CRYSTAL OSCILLATOR NOISE COMPENSATION METHOD FOR A MULTI-LOOP PLL

FIELD OF THE INVENTION

This invention relates to the field of clock synchronization, and in particular to a method of compensating for crystal oscillator noise in a multi-loop phase locked loop (PLL), where one PLL is located within the feedback loop of another PLL, a multi-loop PLL system, and a novel PLL with wander attenuation.

BACKGROUND OF THE INVENTION

The use of PLLs in communications over the years has become an ever-growing trend. New applications with specific synchronization requirements demand complex and flexible PLLs. Economy and the desire for integration require that PLLs support multiple application scenarios, each requiring different synchronization clock criteria. User configurable flexibility has become an essential part of new PLLs.

In a hierarchical timing network, it is desirable to place inexpensive equipment on the line cards at the edge of the network. Wander and jitter filtering is then performed by fewer timing cards with higher quality oscillators further up the timing chain. This works well for a traditional system that derives timing information from physical pulses in the form of electrical signals on the network and is configured with PLLs arranged in a cascaded fashion, with the output of one PLL feeding the input of the next. However, in a Timing over Packet (ToP) switched network, wherein timing information is derived from a timing packets using a clock recovery algorithm, it is desirable to implement the clock recovery algorithm on the line cards and to use the output of a filter of the timing card to drive the PHYs (physical interfaces) on the line cards that time stamp incoming timing packets. This arrangement improves the quality of the clock recovered by the line card by removing the effects of the inexpensive local oscillator used on the line card. Additionally, it simplifies the timing card design because no ToP data needs to be transferred up the timing chain. The timing card can operate with only electrical clock signals as inputs and outputs. A side effect of this configuration however is that the timing card PLL is inside the feedback loop of the ToP clock recovery algorithm. This arrangement creates a multi loop PLL system. In the traditional (non-ToP) PLL system based on electrical signals the two PLLs will be cascaded as shown in FIG. 1, where $PLL_1$ is in the line card and $PLL_2$ is in the timing card. As long as the bandwidth of the line card $PLL_1$ is much higher than that of the timing card $PLL_2$, the overall system transfer function will be defined by the timing card $PLL_2$ transfer function.

A block diagram of a ToP system with the timing card $PLL_2$ inside the feedback loop of the line card PLL1 is shown in FIG. 2. Unlike the cascaded PLL system, the bandwidth of this multi-loop PLL is a function of bandwidth of the PLLs on both the timing card and the line card.

FIG. 3 shows a typical prior art ToP line card/timing card system in a first configuration. The clock recovery module implementing the clock recovery algorithm is located on the timing card. This arrangement requires a complex data interface between the two cards to transfer time stamps and other connection data.

An alternative solution not forming part of the prior art and disclosed in co-pending patent application Ser. No. 61/927,013 filed Jan. 14, 2014, is to place the clock recovery module on the line card as shown in FIG. 4. This second configuration greatly simplifies the interface between the timing card and the line card, and is closer to traditional PLL systems employing electrical signals where the timing card PLL is mainly used to clean up the output wander of the PLL on the line card.

Both the above configurations constitute multi-loop PLL systems where one PLL is inside the feedback loop of the other PLL. In the case of FIG. 3, the line card $PLL_1$ is in the feedback loop of the clock recovery algorithm on the timing card while in the case of FIG. 4, the timing card $PLL_2$ is in the feedback loop of the clock recovery algorithm. Although the system of FIG. 4 requires at least three PLLs, $PLL_3$ is set to a much higher bandwidth than $PLL_2$, so it does not affect the transfer function of the system as a whole. Its role is to perform frequency conversion between the timing card and the PHY.

Also, since the line card $PLL_1$ in the configuration of FIG. 3 has much higher bandwidth than the clock recovery algorithm on the timing card, even though the line card $PLL_1$ is in the feedback loop of the clock recovery algorithm, it does not affect its bandwidth. The clock recovery module residing on the timing card can take advantage of the high quality local oscillator that is typically used o the timing cards to generate less output phase wander originating from the local oscillator.

In the configuration of FIG. 4, where the ToP clock recovery is performed on the line card there are two challenges. Since the bandwidth of the timing card $PLL_2$ can be comparable to that of the clock recovery algorithm, the overall transfer function will be affected by the timing card $PLL_2$. In this case, the timing recovery algorithm needs to be designed in such a way as to compensate for the effect of the timing card $PLL_2$. Also, since the clock recovery module resides on the line card it needs to handle the high amount of oscillator wander due to the uncompensated, low quality crystal oscillators typically used on the line cards.

Because there are more of them, the quality of local oscillator on line cards is typically much lower than on the timing cards because it would not be cost effective to use high quality oscillators. In the configuration of FIG. 3, with the clock recovery module on the timing card, this is not an issue since the line card $PLL_1$ has much higher bandwidth than the timing recovery algorithm. As a result it can effectively filter out all the wander originating from the local oscillator on the line card as the line card $PLL_1$ acts as a high pass filter. In configuration of FIG. 4 where the clock recovery module resides on the line card, the timing card $PLL_2$ bandwidth has to be made narrower so as to filter the jitter originating from the clock recovery algorithm found on the line card. As a result, the timing card $PLL_2$ bandwidth is not high enough to filter out the drift and wander due to the low quality local oscillator employed on the line card. A temperature compensated (TCXO) or oven-controlled (OCXO) crystal oscillator is required. These types of oscillators are more expensive and bulkier compared to uncompensated oscillators.

SUMMARY OF THE INVENTION

According to the present invention there is provided a multi-loop phase locked loop (PLL) system with noise attenuation, comprising a first PLL including a local oscillator; a second PLL coupled to an output of the first PLL; a third PLL in a feedback path between said second PLL and said first PLL, said third PLL providing a first feedback signal; a first phase comparator for comparing an input signal with said first feedback signal to generate a first phase error signal for said first PLL; and a first multiplier for multiplying said first phase error signal by a scaling factor k determining the amount of noise attenuation; and wherein the third PLL has a bandwidth significantly higher than the second PLL, and the transfer function of the third PLL is multiplied by a scaling factor 1/k.

The ratio of bandwidths of the third and second PLLs, wherein one has a significantly higher bandwidth than the other, should be sufficient that the transfer function of two cascaded PLLs is approximately the transfer function of the PLL with the lower bandwidth. The higher the ratio the better the approximation, but the ratio typically should be at least 10:1 and preferably at least 100:1. In this scenario scaling the transfer function of the third PLL by a factor 1/k makes the overall transfer function of the second and third PLLs approximately equal to 1/k G(s), where G(s) is the transfer function of the second PLL.

The invention finds particular application in clock recovery in packet networks where the clock recovery is performed on a line card and the removal of jitter is performed on timing cards further up the timing chain. In this case, the functional block with transfer function H(s) containing the clock recovery module is located between the first multiplier and the first PLL. The output timing signals are provided by the third PLL.

Embodiments of the invention thus employ a novel approach that can attenuate the noise (wander/jitter) of the line card crystal oscillator without affecting the bandwidth of the packet clock recovery algorithm residing on the line card. This approach effectively makes line card oscillator behave like a high quality oscillator similar to the one used on timing card. As a result the timing recovery algorithm can be moved to the line card while maintaining a similar clock recovery performance using the low cost uncompensated crystals (XO) available on the line card.

Embodiments of the invention also provide a PLL whose input wander can be attenuated or amplified. When used in a multi-loop configuration this PLL can attenuate the noise originating from its local oscillator. The amount of attenuation may programmable and does not depend on the loop bandwidth of the PLL.

According to a second aspect of the invention there is provided a PLL comprising a phase comparator for comparing a feedback signal with an input reference signal to obtain a phase error signal; a first multiplier for multiplying the phase error signal by scaling factor 1/k; a loop filter including a proportionate path and an integral path having respective P and I coefficients for determining the bandwidth of the PLL; first and second digital controlled oscillators coupled to an output of said loop filter, said first digital controlled oscillator providing an output and said second digital controlled oscillator providing said feedback signal; and a second multiplier between the output of said loop filter and an input of said second digital controlled oscillator for multiplying an input signal to said second digital controlled oscillator by scaling factor k.

An advantage of the present invention is that it allows the use of an uncompensated crystal for implementing the packet timing recovery algorithm. This allows simpler and more cost effective timing recovery systems to be designed, especially for ToP applications.

In yet another aspect the invention provides a method of attenuating local oscillator noise in a multi-loop PLL system, wherein a first PLL includes a local oscillator, a second PLL is coupled to an output of the first PLL, and a third PLL lies in a feedback path between said second PLL and said first PLL, said third PLL providing a feedback signal to said first PLL, the method comprising: multiplying first a phase error input signal to said first PLL derived from said feedback signal by a scaling factor k; setting the bandwidth of the third PLL to be significantly higher than the bandwidth of the second PLL; and multiplying the transfer function of the third PLL by a scaling factor 1/k.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENT

There are generally considered to be two types of PLLs: type 1 and type 2. A characteristic of a type 1 PLL is that it only has a proportionate path in the loop filter. A characteristic of a type 2 PLL is that the loop filter contains a proportionate path in parallel with an integral path. A PLL that retains this characteristic of a type 2 PLL but contains modifications in accordance with embodiments of the invention will be generally referred to herein as a modified type 2 PLL.

Figure 1:
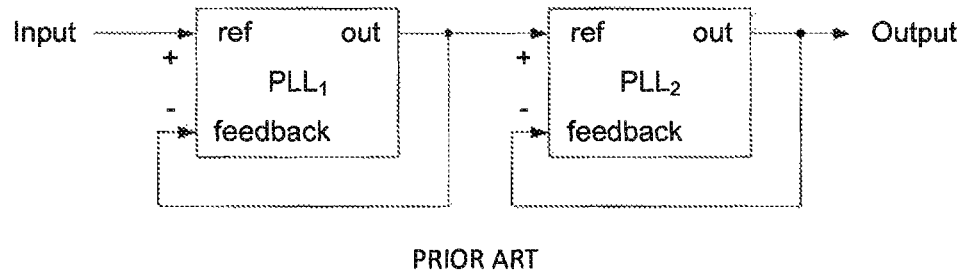
FIG. 1 is a block diagram of a prior art cascaded PLL system.
Figure 2:
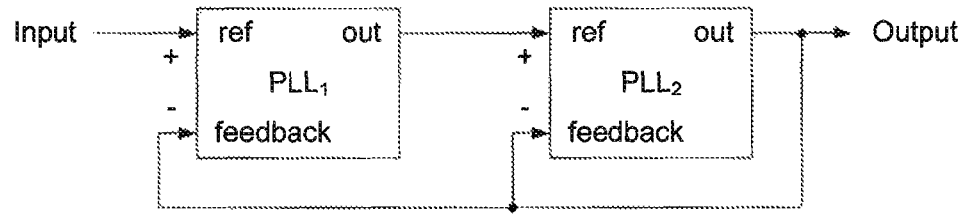
FIG. 2 is a block diagram of a multi-loop PLL system.
Figure 3:
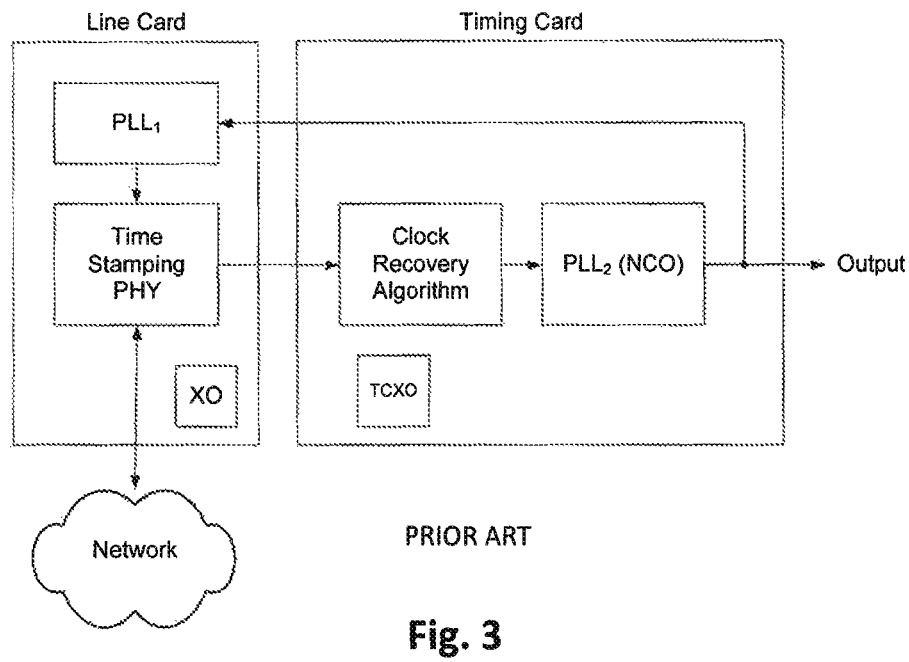
FIG. 3 is a block diagram of a prior art ToP line card/timing card system.
Figure 4:
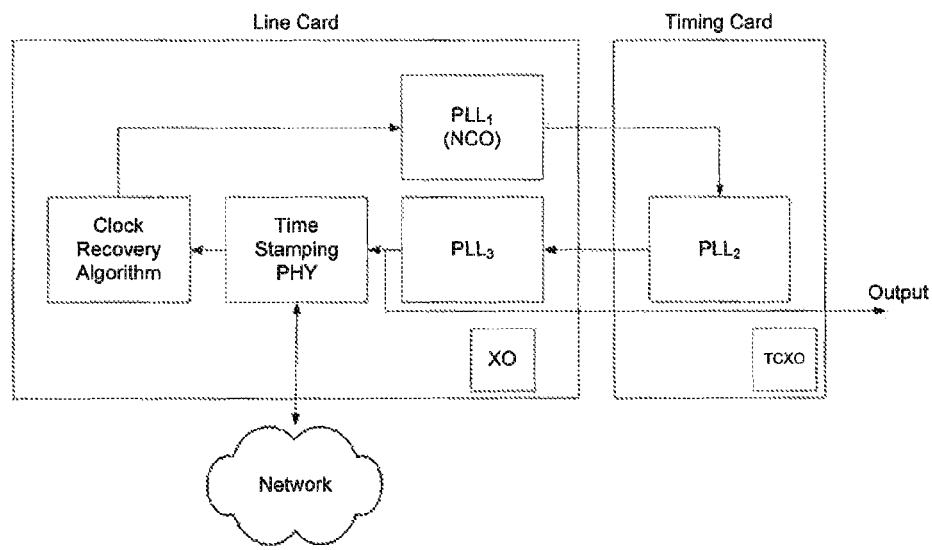
FIG. 4 is a block diagram of a ToP line card/timing card configuration with the clock recovery module on the line card.

In the configuration shown in FIG. 4, where $PLL_2$ is in inside the feedback loop of PLL, it is assumed that $PLL_2$ is a conventional type 2 PLL with a known bandwidth and known damping factor. In accordance with embodiments of the invention $PLL_1$ is a type 2 PLL used in the NCO mode with a programmable wander amplification factor of k and $PLL_3$ is a modified type 2 PLL with a programmable attenuation of 1/k as described in more detail below. k is a programmable value set to achieve the desired attenuation of the local oscillator wander (XO in FIG. 4). For example for 20 dB attenuation k will be set to 10.

$PLL_1$ is used as a (numerically controlled oscillator) NCO for the clock recovery algorithm. The bandwidth of the clock recovery algorithm and $PLL_1$ (NOC) needs to be small to allow for filtering of the phase noise arising as a result of the packet delay variation and is comparable to that of $PLL_2$. The overall bandwidth of the feedback loop, which is governed by $PLL_1$ and $PLL_2$, is determined by the clock recovery algorithm.

The system shown in FIG. 4 is suitable for recovering timing information from timing packets delivered over the illustrated packet network.

Figure 5:
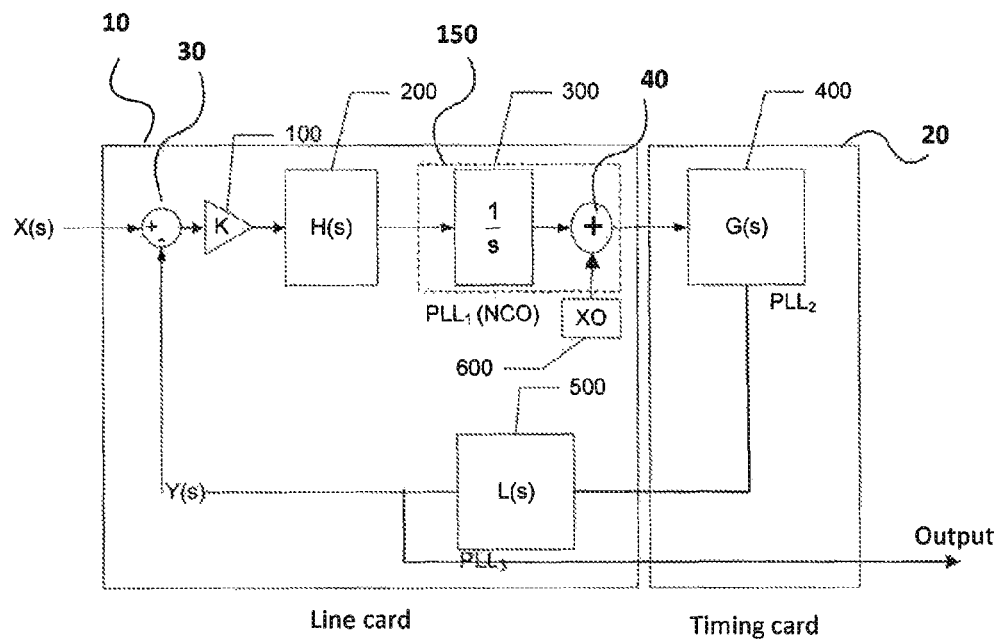
FIG. 5 is a top level block diagram of a line card/timing configuration in accordance with an embodiment of the invention.

A block diagram of a multi-loop PLL system for attenuating local oscillator noise in accordance with an embodiment of the invention is shown in FIG. 5. The system includes a line card 10 and timing card 20. $PLL_1$ 150 and PLL₃ 500 along with the functional block 200 reside on the line card 10. PLL₂ resides on the timing card 400.

Input signal X(s) derived from timing packets received from the network is applied to the first input of phase comparator 30 whose second input receives feedback signal Y(s). The output of the phase comparator 30 is applied to amplifier 100 with gain of k, where k is a programmable parameter controlling the amount of desired attenuation of noise in the local oscillator 600.

The output of the amplifier 100 is applied to the functional block 200, which includes a clock recovery module implementing a clock recovery algorithm, for example, in accordance the IEEE 1588 protocol. The transfer function of the functional block 200 is H(s), where s is the Laplace variable.

The output of the functional block 200 is applied to PLL₁ 150, which includes a numerically controlled oscillator (NCO) 300 having a transfer function 1/s. The output of NCO 300 is applied to one input of adder 40 whose second input receives the output of local oscillator 600, which can be a low-cost uncompensated crystal oscillator. PLL₁ 150 thus in effect acts as a numerically controlled oscillator.

Figure 6:
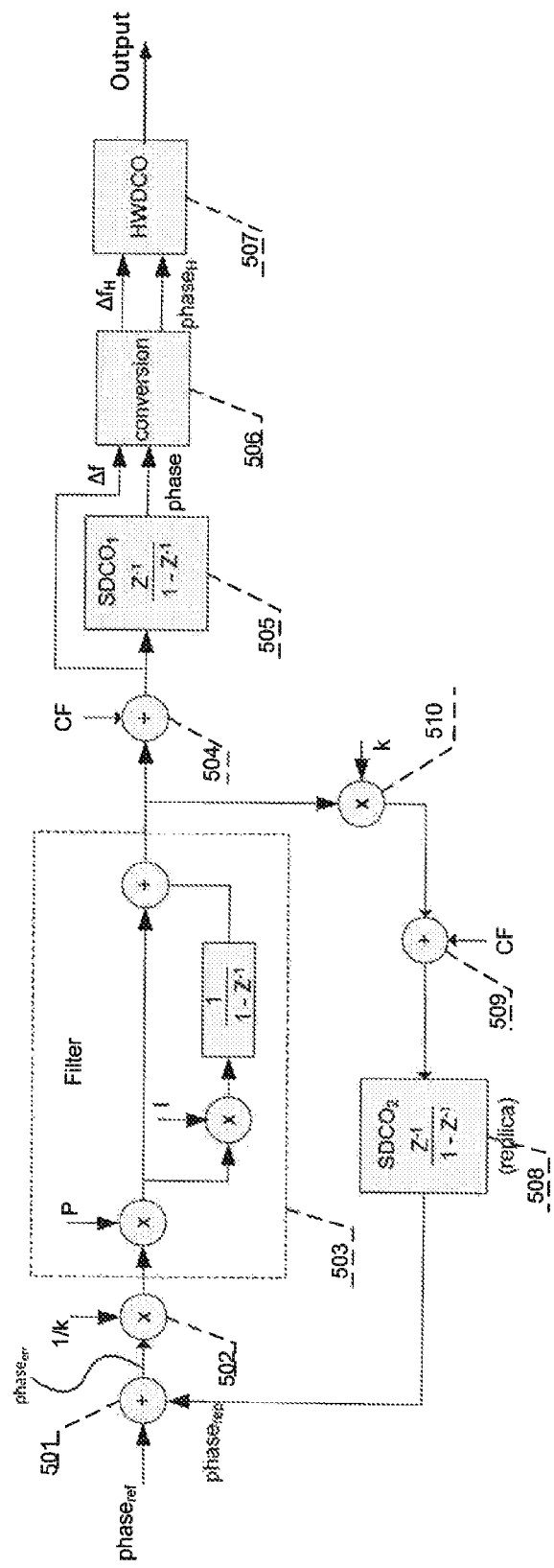
FIG. 6 is preferred embodiment of a PLL with programmable input noise attenuation.

The output of adder 40 is applied to the input of PLL₂ 400, which resides on the timing card 20 and has a transfer function G(s). The output PLL₂ is in turn applied to the input of PLL₃ 500, which is a modified type 2 PLL of which one embodiment is shown in FIG. 6. The PLL₃ 500 has a transfer function L(s).

The system shown in FIG. 5 is a closed loop feedback system with an overall transfer function T(s) given by:

$$T(s) = \frac{k\left(\frac{1}{s}\right)H(s)L(s)G(s)}{1+k\left(\frac{1}{s}\right)H(s)L(s)G(s)} \qquad \text{Equation 1}$$

From the law of superposition for linear systems the output Y(s) of PLL₃ 500 is the sum of the transfer function from X(s) to Y(s) and from XO(s) to Y(s) multiplied by their corresponding input signals, where XO(s) is the output of the local oscillator 600. Y(s) is therefore given by:

$$Y(s) = T(s)X(s) + \frac{G(s)L(s)}{1+k\left(\frac{1}{s}\right)H(s)G(s)L(s)} XO(s) \qquad \text{Equation 2}$$

The objective is to design the transfer function of PLL₃ L(s) in such a way that $$L(s)G(s) = \frac{1}{k}G(s).$$

Substituting this in above equation we will get $$Y(s) = T(s)X(s) + \frac{\frac{1}{k}G(s)}{1+\frac{1}{s}H(s)G(s)} XO(s) \qquad \text{Equation 3}$$

As can be seen from above equation, noise due to local oscillator 600 represented by the second term in the equation is then attenuated by factor of (1/k). For example by setting k=10, this wander will be attenuated by 20 dB. The interim objective is to design PLL₃ with transfer function (L(s)) in such way that the above equation holds, that is:

$$G(s)L(s) \approx 1/kG(s) \qquad \text{Equation 4}$$

An important prerequisite for above relationship to be hold is that the bandwidth of PLL₃ 500 with transfer function L(s) be much higher, at least ten times higher, and preferably 100 times higher, than the bandwidth of PLL₂ with transfer function G(s). This ensures that the transfer function of the PLL₂ with the lower bandwidth predominates for the combination of PLL₂ and PLL₃.

FIG. 6 shows an embodiment of PLL₃ with the desired property described by above equation. In FIG. 6, block 501 is the phase detector that compares the feedback signal phase$_{rep}$ from block 508 with the input reference phase phase$_{ref}$ received from PLL₂ 400 to create a phase error signal phase$_{err}$.

Multiplier 502 scales the output phase error phase$_{err}$ of block 501 by scaling factor of 1/k prior to application to the loop filter 503. The scaling factor results in the input wander to PLL₃ being attenuated by a factor 1/k. However, the effect of adding the scaling factor would be to make the PLL₃ unstable. To overcome this issue, blocks 510, 509 and 508 are added to compensate for effect of the scaling factor 1/k. Block 510 is a multiplier that multiplies the output of the loop filter 503 by k.

The loop filter 503 is the same as that used in a typical type 2 PLL. It consists of a P-part (proportional part), which scales the input signal and controls the loop bandwidth, and the I-part (integral part), which scales the input signal with an integral. For this implementation the PLL₃ bandwidth is set to be much higher than the bandwidth of timing card PLL₂ by a factor of at least ten, and preferably at least 100. By way of non-limiting example, in one embodiment the bandwidth of timing card PLL₂ is 100 millihertz and the bandwidth of PLL₃ may be set to 14 Hz. This can be achieved by appropriately setting the P and I coefficients in the P and P parts of the loop filter 503.

In a cascaded arrangement of a pair of PLLs, where one PLL has a much higher bandwidth than the other, the overall transfer function will be approximately equal to the PLL with the lower bandwidth, so in this case the overall transfer function of PLL₂ and PLL₃ will be approximately equal to that of PLL₂ multiplied by the scaling factor 1/k, which is the desired equation 4.

The output of multiplier 510 is applied to one input of adder 509 whose other input receives an input CF determining the center or free run frequency of the PLL. This is a settable parameter.

The output of adder 509 is applied to the input of a software-implemented digital controlled oscillator (SDCO₂) 508. This has the transfer function $$\frac{Z^{-1}}{1-Z^{-1}}$$

where Z is the Z variable of the Z transform and produces the output phase$_{rep}$ for input to the phase comparator 501.

The output of loop filter 503 is also applied to one input of adder 504 whose second input also receives the center frequency CF. The output of the adder 504 is applied to another software-implemented digital controlled oscillator SDCO₁ 505. The phase output of SDCO₁ 505 along with the Δf output of adder 504 is applied to conversion block 506, which produces frequency and phase inputs $\Delta f_H$ and phase H for the hardware-implemented digital controlled oscillator HWDCO 507. The output of HWDCO 10 provides the smoothed timing signals recovered from the network.

The software-implemented DCOs 505, 508 mimic, that is exhibit the same behavior as, the actual DCO 507 that is implemented in hardware. The output phase $phase_{rep}$ of $SDCO_2$ 508 is compared with the reference phase ($phase_{ref}$) to create the phase error $phase_{err}$ for the input to loop filter 503. This closes PLL loop. The loop filter 503 uses the phase error $phase_{err}$ to control $SDCO_2$ 508 so that $SDCO_2$ will be synchronized with reference clock $phase_{ref}$.

The difference between the above structure and a classic type 2 PLL is that the scaling factor 1/k is inserted into the phase error. This reduces the phase error and hence the output of loop filter 503. As a result both the frequency offset and jitter/wander noise are reduced correspondingly. However, another scaling factor k is inserted to the filter output and this cancels the effect of the scaling of the phase error. As a result the PLL loop performance is unchanged, including the filter bandwidth and noise tolerance.

The clock output is not taken from $SDCO_2$ 508 but from $SDCO_1$ 505. As the $SDCO_1$ 505 takes the filter output as its input, it has reduced frequency offset and jitter noise compared to a conventional type 2 PLL. $SDCO_1$ 505 is synchronized with $SDCO_2$ 508 and hence the reference phase $phase_{ref}$, but with different frequency offset and noise performance.

The conversion block 506 converts the phase and frequency information received from $SDCO_1$ 505 to signals usable by hardware DCO 507. The $SDCO_1$ 505 will control its image output, namely the hardware DCO 507. As the result, the hardware DCO 507 output clock producing the timing signals is synchronized with $SDCO_1$ 505 with reduced jitter and frequency offset. The hardware DCO 507 creates the actual output clock signals based on the input frequency and phase information received from the conversion block 506.

It will be appreciated that although in this embodiment DCOs 505 and 508 are implemented in software, and DCO 507 is implemented in hardware, the DCOs 505, 508, 509 can be implemented in either software or hardware. A software implementation gives greater flexibility and is thus particularly suitable for DCOs 505, 508. The conversion unit 506 is required if the software and hardware DCOs do not employ the same number of bits or run at different clock frequencies, but otherwise it can be dispensed with.

It should be appreciated by those skilled in the art that any block diagrams herein represent conceptual views of illustrative circuitry embodying the principles of the invention. The functional blocks or modules illustrated herein may in practice be implemented in hardware or software running on a suitable processor. For example, a processor may be provided through the use of dedicated hardware as well as hardware capable of executing software in association with appropriate software, When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage, Other hardware, conventional and/or custom, may also be included.

We claim:

1. A multi-loop phase locked loop (PLL) system with noise attenuation, comprising:
   a first PLL including a local oscillator;
   a second PLL coupled to an output of the first PLL;
   a third PLL in a feedback path between said second PLL and said first PLL, said third PLL providing a first feedback signal;
   a first phase comparator for comparing an input signal with said first feedback signal to generate a first phase error signal for said first PLL; and
   a first multiplier for multiplying said first phase error signal by a scaling factor k determining the amount of noise attenuation; and
   wherein the third PLL has a bandwidth significantly higher than the second PLL, and the transfer function of the third PLL is multiplied by a scaling factor 1/k.

2. A multi-loop PLL system as claimed in claim 1, wherein the ratio of bandwidths of the third and second PLLs is at least 10:1.

3. A multi-loop PLL system as claimed in claim 1, wherein said scaling factor is programmable.

4. A multi-loop PLL system as claimed in claim 1, wherein the first multiplier is coupled to an input of the first PLL by a functional block having a known transfer function.

5. A multi-loop PLL system as claimed in claim 4, wherein the functional block comprises a clock recovery module implementing a clock recovery algorithm and time stamping function for extracting timing information from timing packets delivered over a packet network.

6. A multi-loop PLL system as claimed in claim 1, wherein said third PLL comprises:
   a second phase comparator for comparing a second feedback signal a input reference signal derived from said second PLL to obtain a second phase error signal;
   a first multiplier for multiplying the second phase error signal by scaling factor 1/k;
   a loop filter including a proportionate path and an integral path having respective P and I coefficients for determining the bandwidth of the third PLL;
   a first and a second digital controlled oscillator coupled to an output of said loop filter, said first digital controlled oscillator providing an output and said second digital controlled oscillator providing said feedback signal; and
   a second multiplier between the output of said loop filter and an input of said second digital controlled oscillator for multiplying an input signal for said second digital controlled oscillator by scaling factor k.

7. A multi-loop PLL system as claimed in claim 6, further comprising first and second adders for adding a programmable center frequency to said first and second digital controlled oscillators.

8. A multi-loop PLL system as claimed in claim 7, wherein said first and second digital controlled oscillators are implemented in software, and further comprising a third digital controlled oscillator implemented in hardware, said first digital controlled oscillator providing an input to said third digital controlled oscillator.

9. A multi-loop PLL system as claimed in claim 8, further comprising a conversion module for converting the output signal of said first digital controlled oscillator to a form suitable for serving as an input to said third digital controlled oscillator.

10. A multi-loop PLL system as claimed in claim 1, wherein the multi-loop PLL system is part of a clock recovery system for a packet network, the first and third PLLs reside on a line card, the second PLL resides on a timing card, the input to the first PLL is received from a clock recovery module on the line card, and the third PLL outputs recovered timing signals.

11. A phase locked loop (PLL) comprising:
a phase comparator for comparing a feedback signal with an input reference signal to obtain a phase error signal;
a first multiplier for multiplying the phase error signal by scaling factor $1/k$;
a loop filter including a proportionate path and an integral path having respective P and I coefficients for determining the bandwidth of the PLL;
first and second digital controlled oscillators coupled to an output of said loop filter, said first digital controlled oscillator providing an output and said second digital controlled oscillator providing said feedback signal; and
a second multiplier between the output of said loop filter and an input of said second digital controlled oscillator for multiplying an input signal to said second digital controlled oscillator by scaling factor k.

12. A PLL as claimed in claim 11, further comprising first and second adders for adding a programmable center frequency to said first and second digital controlled oscillators.

13. A PLL as claimed in claim 11, wherein said first and second digital controlled oscillators are implemented in software, and further comprising a third digital controlled oscillator implemented in hardware, said first digital controlled oscillator providing an input to said third digital controlled oscillator.

14. A PLL as claimed in claim 13, further comprising a conversion module for converting the output signal of said first digital controlled oscillator to a form suitable for serving as an input to said third digital controlled oscillator.

15. A method of attenuating local oscillator noise in a multi-loop phase locked loop (PLL) system, wherein a first PLL includes a local oscillator, a second PLL is coupled to an output of the first PLL, and a third PLL lies in a feedback path between said second PLL and said first PLL, said third PLL providing a feedback signal to said first PLL, the method comprising:
multiplying first a phase error input signal to said first PLL derived from said feedback signal by a scaling factor k;
setting the bandwidth of the third PLL to be significantly higher than the bandwidth of the second PLL; and
multiplying the transfer function of the third PLL by a scaling factor $1/k$.

16. A method as claimed in claim 15, wherein the ratio of bandwidths of the third and second PLLs is at least 10:1.

17. A method as claimed in claim 15, wherein in the third PLL a second phase error signal input to a loop filter is multiplied by scaling factor $1/k$, and the output of the loop filter is passed to a first digital controlled oscillator providing an output signal and to a second digital controlled oscillator through a multiplier by k to provide a second feedback signal for comparison with an output signal from the second PLL to provide said second phase error signal.

18. A method as claimed in claim 17, wherein first and second digital controlled oscillators are implemented in software.

19. A method as claimed in claim 18, wherein the output signal from the first digital controlled oscillator is passed to a third digital controlled oscillator implemented in hardware.

20. A method as claimed in claim 15, wherein the multi-loop PLL system is part of a clock recovery system for packet networks, the first and third PLLs reside on a line card, the second PLL resides on a tuning card, the input to the first PLL is received from a clock recovery module on the line card, and the third PLL provides timing signals.

* * * * *